United States Patent
Ma et al.

(10) Patent No.: US 9,909,204 B2
(45) Date of Patent: Mar. 6, 2018

(54) FRAME FOR MASK PLATE AND MASK PLATE

(71) Applicant: BOE TECHNOLOGY GROUP CO., LTD., Beijing (CN)

(72) Inventors: Lifei Ma, Beijing (CN); Joohyeon Lee, Beijing (CN)

(73) Assignee: BOE Technology Group Co., Ltd, Beijing (CN)

(*) Notice: Subject to any disclaimer, the term of this patent is extended or adjusted under 35 U.S.C. 154(b) by 50 days.

(21) Appl. No.: 14/906,361

(22) PCT Filed: Jun. 16, 2015

(86) PCT No.: PCT/CN2015/081528
§ 371 (c)(1),
(2) Date: Jan. 20, 2016

(87) PCT Pub. No.: WO2016/119372
PCT Pub. Date: Aug. 4, 2016

(65) Prior Publication Data
US 2016/0369388 A1    Dec. 22, 2016

(30) Foreign Application Priority Data

Jan. 29, 2015  (CN) .......................... 2015 1 0047911

(51) Int. Cl.
C23C 14/04        (2006.01)
C23C 16/04        (2006.01)

(52) U.S. Cl.
CPC ............ C23C 14/04 (2013.01); C23C 14/042 (2013.01); C23C 16/04 (2013.01); C23C 16/042 (2013.01)

(58) Field of Classification Search
CPC ....... C23C 14/04; C23C 14/042; C23C 16/04; C23C 16/042
See application file for complete search history.

(56) References Cited

U.S. PATENT DOCUMENTS 4,676,193 A * 6/1987 Martin .................. C23C 14/042
                                                  118/504
8,343,278 B2   1/2013 Sung et al.
(Continued)

FOREIGN PATENT DOCUMENTS

CN    202913045 U    5/2013
CN    103820753 A    5/2014
(Continued)

OTHER PUBLICATIONS

The First Office Action dated Aug. 29, 2016 corresponding to Chinese application No. 201510047911.4.
(Continued)

*Primary Examiner* — Jeffrie R Lund
(74) *Attorney, Agent, or Firm* — Nath, Goldberg & Meyer; Joshua B. Goldberg; Annie Kock

(57) ABSTRACT

The present invention discloses a frame for a mask plate and a mask plate. The frame comprises a frame body and a frame through hole passing through the frame body in the thickness direction, a first recessed portion being provided around the frame through hole at an inner periphery of the frame body, the first recessed portion having a continuous bottom surface for providing masks thereon, and a second recessed portion being provided inside the first recessed portion, the second recessed portion being used for providing a shielding film thereon so that the position of the shielding film corresponds to the positions of gaps between adjacent ones of the masks.

12 Claims, 4 Drawing Sheets

(56) References Cited

U.S. PATENT DOCUMENTS

| | | | | |
|---|---|---|---|---|
| 8,631,761 B2* | 1/2014 | Kang | ............... | C23C 14/042 118/504 |
| 9,780,305 B2* | 10/2017 | Kwen | ............... | H01L 51/0011 |
| 2002/0058400 A1* | 5/2002 | Suguro | ............... | B82Y 10/00 438/514 |
| 2006/0222965 A1* | 10/2006 | Tsuruko | ............... | C23C 14/042 430/5 |
| 2011/0139069 A1* | 6/2011 | Ahn | ............... | C23C 14/042 118/504 |
| 2011/0220019 A1* | 9/2011 | Lee | ............... | C23C 14/042 118/504 |
| 2013/0186335 A1* | 7/2013 | Kawato | ............... | C23C 14/042 118/720 |
| 2014/0120796 A1* | 5/2014 | Kim | ............... | G03F 7/0015 445/66 |
| 2015/0101536 A1* | 4/2015 | Han | ............... | C23C 14/042 118/721 |
| 2016/0079568 A1* | 3/2016 | Han | ............... | C23C 18/1616 438/34 |
| 2016/0369388 A1* | 12/2016 | Ma | ............... | C23C 14/042 |
| 2017/0056911 A1* | 3/2017 | Kang | ............... | H01L 51/0011 |
| 2017/0104186 A1* | 4/2017 | Li | ............... | H01L 51/56 |
| 2017/0110661 A1* | 4/2017 | Lee | ............... | H01L 51/0011 |
| 2017/0141313 A1* | 5/2017 | Min | ............... | C23C 14/042 |
| 2017/0263867 A1* | 9/2017 | Kim | ............... | H01L 51/0011 |

FOREIGN PATENT DOCUMENTS

| | | |
|---|---|---|
| CN | 103911584 A | 7/2014 |
| CN | 104169455 A | 11/2014 |
| CN | 104611668 A | 5/2015 |
| JP | 2004335382 A | 11/2004 |
| KR | 20140008567 A | 1/2014 |
| TW | 201432083 A | 8/2014 |

OTHER PUBLICATIONS

International Search Report dated Nov. 3, 2015 corresponding to International application No. PCT/CN2015/081528.

* cited by examiner

FRAME FOR MASK PLATE AND MASK PLATE

This is a National Phase Application filed under 35 U.S.C. 371 as a national stage of PCT/CN2015/081528, filed Jun. 16, 2015, an application claiming the benefit of Chinese Application No. 201510047911.4, filed Jan. 29, 2015, the content of each of which is hereby incorporated by reference in its entirety.

FIELD OF THE INVENTION

The present invention relates to the field of display panel manufacturing, and in particular to a frame for a mask plate and a mask plate including this frame.

BACKGROUND OF THE INVENTION

In a semiconductor manufacturing process, the evaporation technology is often required. Taking the preparation of an organic light-emitting diode (OLED) display screen as an example, it is required to use a fine metal mask (FMM) and heat material to be evaporated from below, so that the material is evaporated or sublimated upward and then deposited or sputtered onto the surface of a substrate to be evaporated by passing through a designed opening of the mask, to form a desired film pattern.

FIG. 1 and FIG. 2 are schematic structure diagrams of an existing mask plate for evaporation. The mask plate generally includes a frame 11, a plurality of masks 12, a shielding film 13 and the like. The plurality of masks 12 and the shielding film 13 are all welded onto the frame 11 provided for carrying them thereon. The plurality of masks 12 are required to be combined with the frame 11, i.e., to be stretched. The shielding film 13 is required to be welded in a gap 14 between adjacent ones of the masks 12 to shield the gap 14, to prevent the material from being evaporated onto the substrate by passing through the gap 14 to result in color mixture.

During stretching, the shielding film 13 is welded onto the frame 11 first, and then the masks 12 are welded. A recessed portion for placing the masks 12 and the shielding film 13 therein will be provided on the frame 11 in advance. In order to ensure the flatness of the entire mask plate, a groove, reversed for the shielding film 13 on the frame 11, will be provided on the bottom surface of the recessed portion reserved for the masks 12, as shown in FIG. 2.

Generally, the masks 12 are very thin. In the prior art shown in FIG. 2, as arranging the groove reserved for the shielding film 13 on the bottom surface of the recessed portion reserved for the masks 1.2 breaks the bottom surface of the recessed portion reserved for the masks 12 and thus this bottom surface is not continuous, edges and corners, closer to the gaps 14, of the masks 12 are not supported by the frame 11 and also not welded onto the frame 11. This easily results in warps, crimps and other undesirable phenomena of the masks 12 at these positions. Furthermore, when welding the masks 12, it is required to apply a tension to the masks 12 to flatten the masks 12, and at the same time, the welding is performed by using welding tools. If the tension is not appropriate during welding, the masks 12 will be folded, thereby reducing the evaporation yield.

SUMMARY OF THE INVENTION

An objective of the present invention is to provide a frame for a mask plate and a mask plate, to avoid wraps or folds of edges of the masks and thus to increase the evaporation yield.

In order to solve the aforementioned technical problems, as a first aspect of the present invention, a frame for a mask plate is provided, including a frame body and a frame through hole passing through the frame body in the thickness direction, wherein a first recessed portion is provided around the frame through hole at an inner periphery of the frame body, the first recessed portion has a continuous bottom surface for providing masks thereon, a second recessed portion is provided inside the first recessed portion, and the second recessed portion is configured for providing a shielding film thereon so that position of the shielding film corresponds to the position of gaps between adjacent ones of the masks.

Preferably, the frame further includes at least one supporting portion formed on the second recessed portion, wherein position of the supporting portion corresponds to the position of the gaps between adjacent ones of the masks; and the upper surface of the supporting portion is flush with the bottom surface of the first recessed portion so that edges, closer to the gaps, of the masks are fixed onto the supporting portion.

Preferably, one supporting portion is arranged on the frame along the extension direction of each of the gaps, the supporting portion has a recessed portion for the supporting portion provided thereon, and the recessed portion for the supporting portion is configured for receiving the shielding film; and the shielding film shields the gaps together with the supporting portion.

Preferably, two supporting portions are arranged on the frame along the extension direction of each of the gaps, with a space for receiving the shielding film reserved between the two supporting portions, and the shielding film shields the gaps together with the supporting portions.

As a second aspect of the present invention, a mask plate is further provided, including the frame provided by the present invention, masks provided in the first recessed portion and a shielding film provided in the second recessed portion, wherein pattern of each of the masks comprises a mask through hole located within a region defined by the frame through hole, and the position of the shielding film corresponds to the position of gaps between adjacent ones of the masks.

Preferably, the frame further includes at least one supporting portion formed on the second recessed portion, wherein position of the supporting portion corresponds to the position of the gaps between adjacent ones of the masks; and the upper surface of the supporting portion is flush with the bottom surface of the first recessed portion so that edges, closer to the gap, of the masks are fixed onto the supporting portion, and other edges of the masks are fixed onto the bottom surface of the first recessed portion.

Preferably, one supporting portion is arranged on the frame along the extension direction of each of the gaps, the supporting portion has a recessed portion for the supporting portion provided thereon, the shielding film is partially located in the recessed portion for the supporting portion, and the shielding film shields the gaps together with the supporting portion.

Preferably, two supporting portions are arranged on the frame along the extension direction of each of the gaps, with a space reserved between the two supporting portions, the shielding film is partially located in the space, and the shielding film shields the gaps together with the supporting portions.

Preferably, the frame, the masks and the shielding film are all made of invar or invar alloy, the masks are welded into the first recessed portion, and the shielding film is welded into the second recessed portion.

Preferably, the extension direction of the shielding film is perpendicular to the extension direction of the gaps.

In the present invention, fixing a plurality of edges and all corners of the masks onto the frame avoids the suspended state of the edges and corners of the masks, thereby reducing warps and folds of the masks, and consequently improving the quality of the mask plate and increasing the evaporation yield.

BRIEF DESCRIPTION OF THE DRAWINGS

The accompanying drawings are used to provide further understanding of the present invention, constitute a part of the specification, and are used to explain the present invention together with specific implementations hereinafter but not intended to limit the present invention.

FIG. 9 is a second schematic structure diagram of the mask plate provided by the embodiments of the present invention, in which:

11: frame in the prior art; 12: mask; 121: mask through hole; 13: shielding film; 14: gap; 21: frame in the present invention; 211: frame body; 212: frame through hole; 213: first recessed portion; 214: supporting portion; 215: second recessed portion; 51: recessed portion for supporting portion; and 52: space.

DESCRIPTION OF THE PREFERRED EMBODIMENT

The specific implementations will be described in detail below with reference to the accompanying drawings. It should be understood that the specific implementations to be described here are merely used to describe and explain the present invention, and not intended to limit the present invention.

Figure 3:
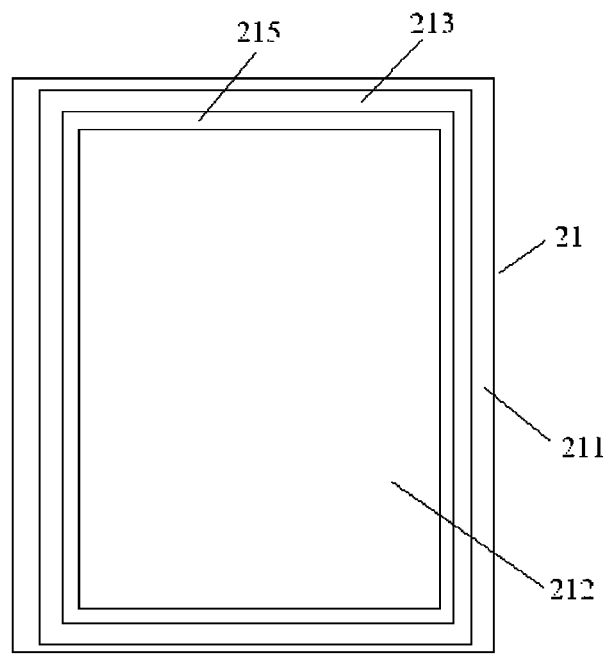
FIG. 3 is a first schematic structure diagram of a frame provided by embodiments of the present invention.

The present invention provides a frame for a mask plate first, as shown in FIG. 3. The frame 21 includes a frame body 211 and a frame through hole 212 passing through the frame body 211 in the thickness direction. A first recessed portion 213 (i.e., a step portion recessed downward from the top of the frame 21) for providing masks 12 thereon is formed on the frame body 211. The first recessed portion 213 has a continuous bottom surface and forms a step structure between the first recessed portion 213 and the frame body 211. The second recessed portion 215 is provided on the inner side of the first recessed portion 213 (i.e., a step portion recessed downward from the bottom surface of the first recessed portion 213), and the second recessed portion 215 also forms a step structure together with the first recessed portion 213. Accordingly, the frame body 211, the first recessed portion 213 and the second recessed portion 215 form three continuous step structures. The second recessed portion 215 is used to provide the shielding film 13 thereon, so that the position of the shielding film 13 corresponds to the positions of the gaps of adjacent ones of the masks 12. As the shielding film 13 is just required to shield the gaps between the adjacent ones of the masks 12, the second recessed portion 215 having a discontinuous bottom surface may be arranged only at a corresponding local position inside the first recessed portion 213, as long as the arranged second recessed portion 215 can bear the shielding film. Of course, the second recessed portion 215 having a continuous bottom surface may be arranged at an inner periphery of the first recessed portion 213.

Figure 1:
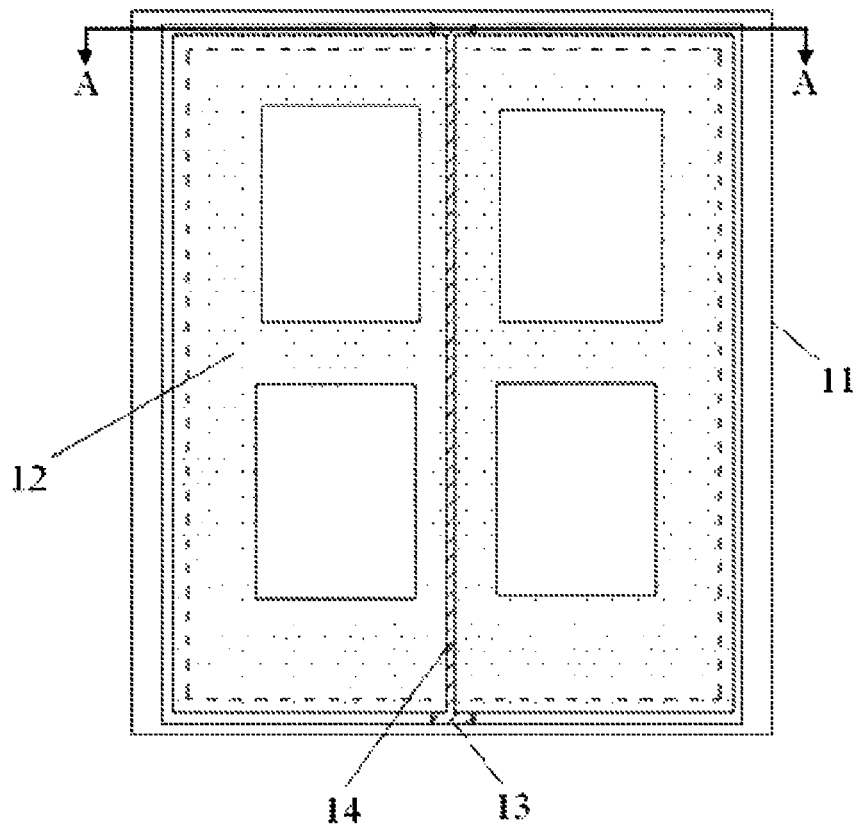
FIG. 1 is a schematic structure diagram of an existing mask plate.
Figure 2:
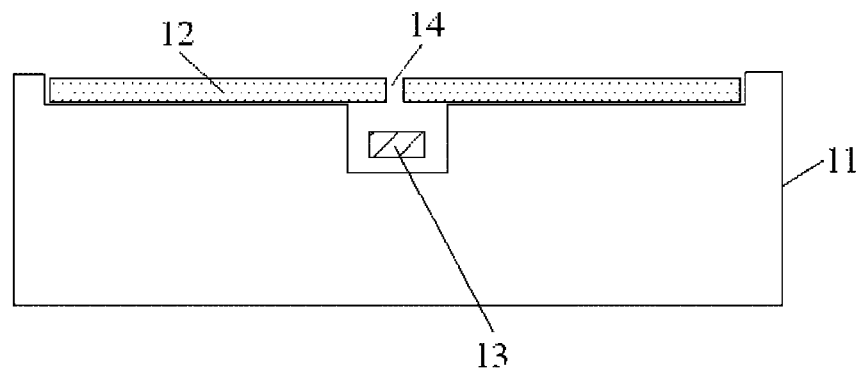
FIG. 2 is a sectional view of the mask plate along a line A-A of FIG. 1.

Compared with the prior art, in the present invention, more edges and all corners of the masks 12 can be fixed onto the first recessed portion 213, that is, can be fixed onto the continuous bottom surface of the of the first recessed portion 213. Compared with the prior art where the recessed portion reserved for the masks has a discontinuous bottom surface shown in FIG. 1, the present invention mitigates the problem of suspension of some edges and corners of the masks in the prior art, thereby reducing warps and folds of the edges and corners of the masks, and consequently increasing the evaporation yield.

Figure 4:
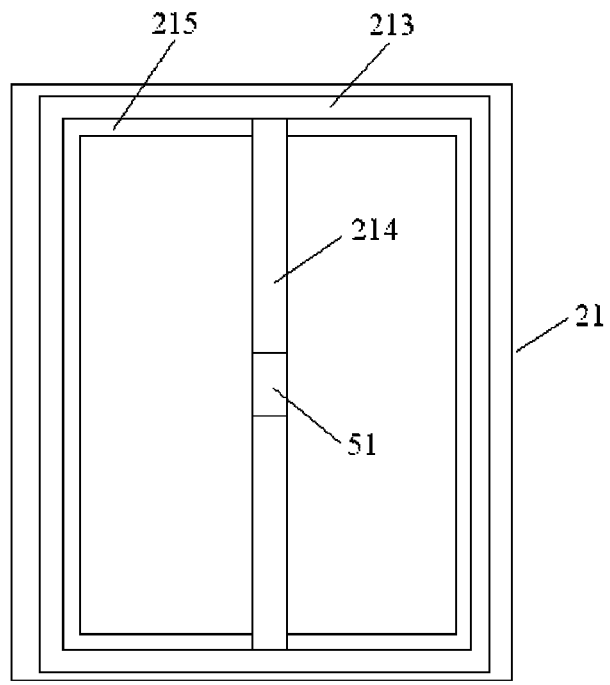
FIG. 4 is a second schematic structure diagram of the frame provided by the embodiments of the present invention.

Further, as shown in FIG. 4, the frame 21 further includes at least one supporting portion 214 formed on the second recessed portion 215, the position of the supporting portion 214 corresponding to the position of gap between adjacent masks 12; and the upper surface of the supporting portion 214 is flush with the bottom surface of the first recessed portion 213 so that edges, closer to the gap 14, of the masks 12 are fixed onto the supporting portion 214.

In the present invention, the arrangement of the supporting portion 214 enables all the edges of the masks 12 to be fixed onto the frame 21. This further prevents the wraps and folds of edges of the masks 12, thereby increasing the evaporation yield.

FIG. 4 is a first implementation in which the frame 21 has the supporting portion 214 provided therein. One supporting portion 214 is arranged on the frame 21 along the extension direction of each of the gaps 14 (in order to be understood conveniently, the description is given by taking each frame 21 bearing two masks 12 as an example, there is one gap 14 between the two masks 12, and hence, FIG. 4 shows one supporting portion 214). The supporting portion 214 has a recessed portion for the supporting portion 51 provided thereon and the recessed portion for the supporting portion 51 is used for receiving the shielding film 13, and the shielding film 13 shields the gap 14 together with the supporting portion 214.

Figure 5:
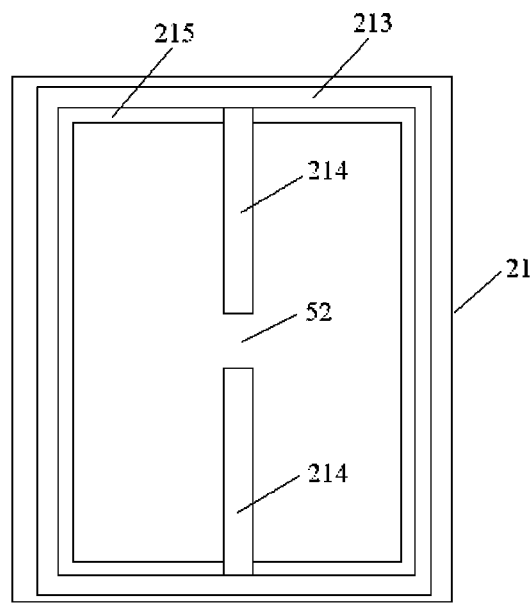
FIG. 5 is a third schematic structure diagram of the frame provided by the embodiments of the present invention.

FIG. 5 is a second implementation in which the frame 21 has the supporting portion 214 provided therein. As shown in FIG. 5, two supporting portions 214 are arranged on the frame 21 along the extension direction of each of the gaps 14 (in order to be understood conveniently, the description is given by taking each frame 21 bearing two masks 12 as an example, there is one gap 14 between the two masks 12, and hence, FIG. 5 shows two supporting portions 214 corresponding to the gap 14), with a space 52 for receiving the shielding film 13 reserved between the two supporting portions 214, and the shielding film 13 shields the gap 14 together with the supporting portions 214.

The descriptions above are preferred implementations of the present invention. In the present invention, there may be more than two supporting portions 214 corresponding to the each gap 14 between adjacent ones of the masks 12, and correspondingly, there may be a plurality of shielding films 13, as long as the gaps 14 between adjacent ones of the masks 12 can be shielded to avoid the color mixture during evaporation.

Figure 6:
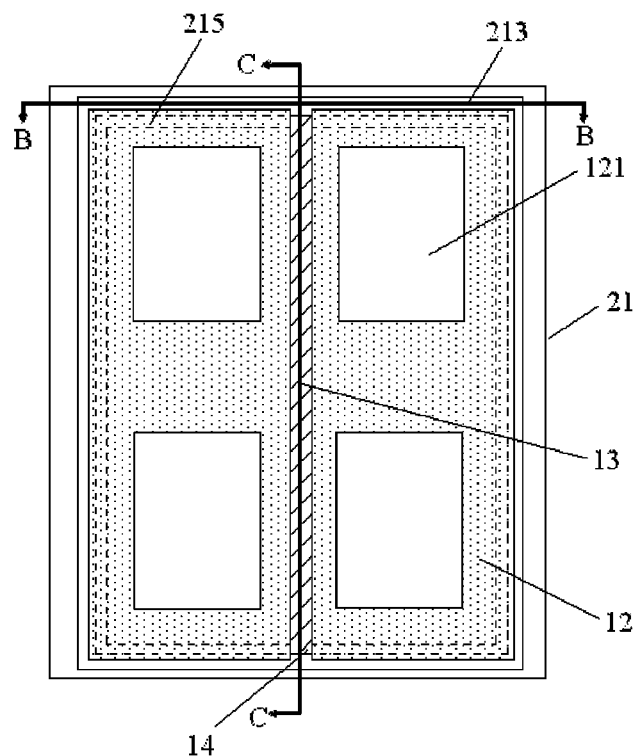
FIG. 6 is a first schematic structure diagram of a mask plate provided by the embodiments of the present invention.

A mask plate is further provided in the present invention. As shown in FIG. 6, the mask plate includes the frame 21 provided by the present invention, masks 12 provided in the first recessed portion 213 and a shielding film 13 provided in the second recessed portion 215, the pattern of each of the masks 12 including a mask through hole 121 located within a region defined by the frame through hole 212, and the position of the shielding film 13 corresponding to the position of gap 14 between adjacent masks 12.

Figure 7:
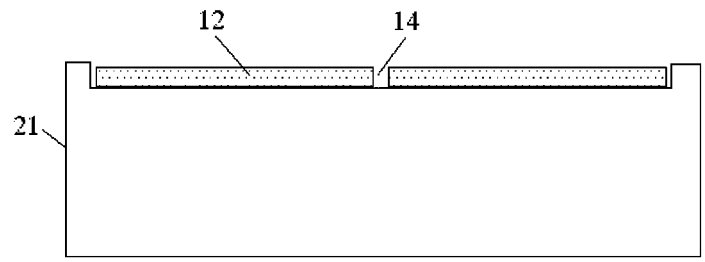
FIG. 7 is a sectional view of the mask plate along a line B-B of FIG. 6.
Figure 8:
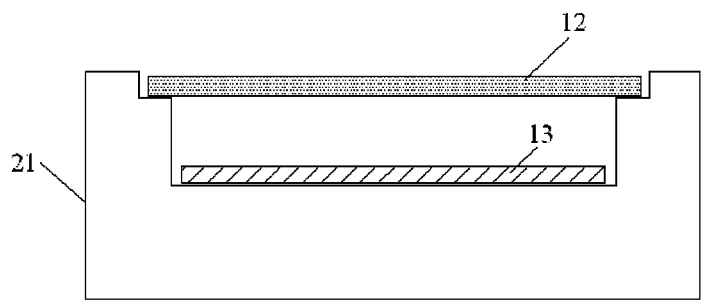
FIG. 8 is a sectional view of the mask plate along a line C-C of FIG. 6.

FIG. 7 and FIG. 8 are respectively sectional views along a line B-B and a line C-C of FIG. 6. It can be seen from FIG. 7 and FIG. 8 that, compared with the prior art, in the present invention, a plurality of edges and all corners of the masks 12 can be fixed onto the frame 21, thereby reducing the probability of wraps and folds of the edges and corners of the masks 12, and consequently improving the quality of the mask plate and increasing the evaporation yield.

Figure 9:
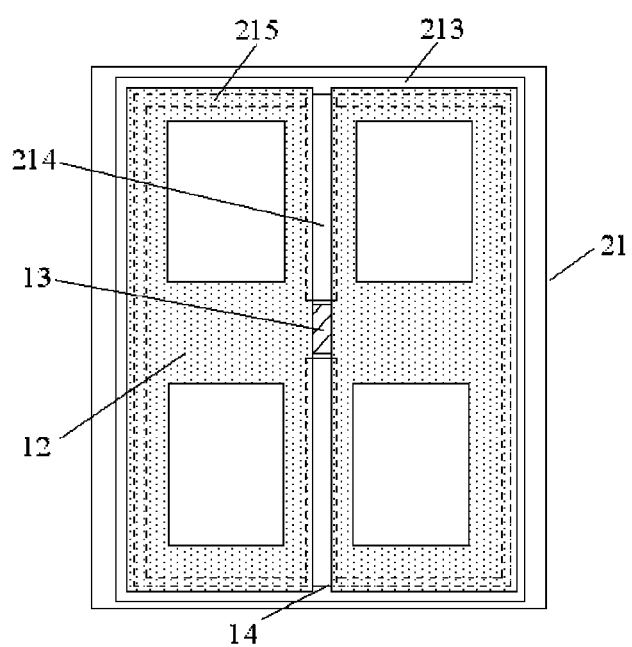

Further, as shown in FIG. 9, the frame 21 further includes at least one supporting portion 214 formed on the second recessed portion 215, the position of the supporting portion 214 corresponding to the position of the gap 14 between the adjacent masks 12; and the upper surface of the supporting portion 214 is flush with the bottom surface of the first recessed portion 213 so that edges, closer to the gap 14, of the masks 12 are fixed onto the supporting portion 214, and other edges of the masks 12 are fixed onto the bottom surface of the first recessed portion 213.

In the present invention, the contact area of the masks 12 and the frame 21 is expanded, so that each edge of the masks 12 can be overlapped on the frame 21, thereby reducing the probability of wraps and folds of the masks 12, and consequently improving the quality of the mask plate.

Correspondingly, when the mask plate employs the frame 21 as shown in FIG. 4, one supporting portion 214 is arranged on the frame 21 along the extension direction of each of the gaps 14, a recessed portion for the supporting portion 51 is arranged on the supporting portion 214, the shielding film 13 is partially located in the recessed portion for the supporting portion 51, and the shielding film 13 shields the gap 14 together with the supporting portion 214.

When the mask plate employs the frame as shown in FIG. 5, two supporting portions 214 are arranged on the frame 21 along the extension direction of each of the gaps 14, with a space 52 in which the shielding film 13 is partially located reserved between the two supporting portions 214, and the shielding film 13 shields the gap 14 together with the supporting portions 214. For mask plates finally formed by the aforementioned two implementations, reference could be made to FIG. 9.

Preferably, the frame 21, the masks 12 and the shielding film 13 are all made of invar or invar alloy, the masks 12 are arranged into the first recessed portion 213 by welding, and the shielding film 13 is arranged into the second recessed portion 215 by welding as well.

Generally, the thicknesses of the masks 12 and the shielding film 13 are tens of microns. The manufacturing flow of the mask plate is as follows: firstly, the shielding film 13 is welded while stretching, where the shielding film 13 is welded while stretching into the second recessed portion 215; and then, the masks 12 are welded while stretching, where the masks 12 are welded while stretching into the first recessed portion 213. It is required to weld edges, closer to the gaps 14, of the masks 12 onto a supporting portion 214 when the frame 21 of the mask plate has the supporting portion 214, thus to further improve the welding quality of the mask plate and avoid crimps and other undesirable phenomena of the masks 12.

In order to reduce the difficulty of machining and manufacturing, the extension direction of the shielding film 13 is preferably perpendicular to the extension direction of the gaps 14, as shown in FIG. 9.

In the present invention, all edges and corners of the masks 12 can be fixed onto the frame 21, thereby reducing the probability of wraps and folds of the masks 12, and consequently improving the quality of the mask plate.

It should be understood that the aforementioned implementations are exemplary implementations merely used to describe the principle of the present invention, and the present invention is not limited thereto. For a person of ordinary skill in the art, various variations and improvements may be made without departing from the spirit and essence of the present invention, and those variations and improvements should also be regarded as falling into the protection scope of the present invention.

The invention claimed is:

1. A frame for a mask plate, comprising a frame body and a frame through hole passing through the frame body in the thickness direction, wherein a first recessed portion is provided around the frame through hole at an inner periphery of the frame body, the first recessed portion has a continuous bottom surface at the inner periphery of the frame body for providing masks thereon, a second recessed portion having a bottom surface is provided inside the first recessed portion, and a shielding film is provided on the second recessed portion so that position of the shielding film corresponds to a first part position of gaps between adjacent ones of the masks.

2. The frame according to claim 1, further comprising at least one supporting portion formed on the bottom surface of the second recessed portion, wherein position of the supporting portion corresponds to a second part position of the gaps between adjacent ones of the masks; and an upper surface of the supporting portion is flush with the bottom surface of the first recessed portion so that edges, closer to the gaps, of the masks are fixed onto the supporting portion.

3. The frame according to claim 2, wherein one supporting portion is arranged on the frame along the extension direction of each of the gaps, the supporting portion has a recessed portion for the supporting portion provided thereon, and the shielding film is provided at the recessed portion for the supporting portion; and the shielding film shields the gaps together with the supporting portion.

4. The frame according to claim 2, wherein two supporting portions are arranged on the frame along the extension direction of each of the gaps, and the shielding film is provided at a space reserved between the two supporting portions, and the shielding film shields the gaps together with the supporting portions.

5. A mask plate, comprising the frame according to claim 1, masks provided in the first recessed portion and a shielding film provided in the second recessed portion, wherein pattern of each of the masks comprises a mask through hole located within a region defined by the frame through hole, and the position of the shielding film corresponds to the position of gaps between adjacent ones of the masks.

6. The mask plate according to claim 5, further comprising at least one supporting portion formed on the bottom surface of the second recessed portion, wherein position of the supporting portion corresponds to a second part position of the gaps between adjacent ones of the masks; and the upper surface of the supporting portion is flush with the bottom surface of the first recessed portion, edges, closer to the gaps, of the masks are fixed onto the supporting portion, and other edges of the masks are fixed onto the bottom surface of the first recessed portion.

7. The mask plate according to claim 6, wherein one supporting portion is arranged on the frame along the extension direction of each of the gaps, the supporting portion has a recessed portion for the supporting portion provided thereon, the shielding film is partially located in the recessed portion for the supporting portion, and the shielding film shields the gaps together with the supporting portion.

8. The mask plate according to claim 7, wherein the frame, the masks and the shielding film are all made of invar or invar alloy, the masks are welded into the first recessed portion and the shielding film is welded into the second recessed portion.

9. The mask plate according to claim 6, wherein two supporting portions are arranged on the frame along the extension direction of each of the gaps, with a space in which the shielding film is partially located reserved between the two supporting portions, and the shielding film shields the gaps together with the supporting portions.

10. The mask plate according to claim 9, wherein the frame, the masks and the shielding film are all made of invar or invar alloy, the masks are welded into the first recessed portion and the shielding film is welded into the second recessed portion.

11. The mask plate according to claim 6, wherein the frame, the masks and the shielding film are all made of invar or invar alloy, the masks are welded into the first recessed portion and the shielding film is welded into the second recessed portion.

12. The mask plate according to claim 5, wherein the frame, the masks and the shielding film are all made of invar or invar alloy, the masks are welded into the first recessed portion and the shielding film is welded into the second recessed portion.

\* \* \* \* \*